(12) United States Patent
Kwak

(10) Patent No.: US 7,142,026 B2
(45) Date of Patent: Nov. 28, 2006

(54) DELAY LOCKED LOOP AND ITS CONTROL METHOD FOR CORRECTING A DUTY RATIO OF A CLOCK SIGNAL

(75) Inventor: Jong-Tae Kwak, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/879,864

(22) Filed: Jun. 29, 2004

(65) Prior Publication Data
US 2005/0110540 A1 May 26, 2005

(30) Foreign Application Priority Data
Nov. 20, 2003 (KR) ............... 10-2003-0082570

(51) Int. Cl.
*H03L 7/06* (2006.01)
(52) U.S. Cl. .................... 327/158; 327/175
(58) Field of Classification Search ........... 327/149, 327/150, 158, 159, 161, 162, 172, 175
See application file for complete search history.

(56) References Cited

U.S. PATENT DOCUMENTS

| | | | | |
|---|---|---|---|---|
| 5,614,855 A | 3/1997 | Lee et al. | | 327/158 |
| 5,945,862 A | 8/1999 | Donnelly et al. | | 327/278 |
| 6,342,801 B1 | 1/2002 | Shin | | 327/175 |
| 6,384,652 B1 | 5/2002 | Shu | | 327/175 |
| 6,452,432 B1 * | 9/2002 | Kim | | 327/158 |
| 6,466,071 B1 * | 10/2002 | Kim et al. | | 327/175 |
| 6,518,809 B1 | 2/2003 | Kotra | | 327/175 |
| 6,639,441 B1 * | 10/2003 | Ono et al. | | 327/175 |
| 6,677,792 B1 * | 1/2004 | Kwak | | 327/158 |
| 6,680,635 B1 * | 1/2004 | Lee | | 327/158 |
| 6,765,421 B1 * | 7/2004 | Brox et al. | | 327/175 |
| 6,803,826 B1 * | 10/2004 | Gomm et al. | | 331/11 |
| 6,853,225 B1 * | 2/2005 | Lee | | 327/158 |
| 6,956,418 B1 * | 10/2005 | Kwak et al. | | 327/158 |
| 7,046,059 B1 * | 5/2006 | Kwak | | 327/158 |
| 2004/0062121 A1 | 4/2004 | Chung et al. | | 365/222 |
| 2004/0066873 A1 | 4/2004 | Cho et al. | | 375/376 |

* cited by examiner

Primary Examiner—Timothy P. Callahan
Assistant Examiner—Hai L. Nguyen
(74) Attorney, Agent, or Firm—Blakely Sokoloff Taylor & Zafman

(57) ABSTRACT

A delay locked loop (DLL) capable of correcting a duty ratio including: a clock buffer for receiving an external clock signal and an inverted external clock signal to generate a rising edge clock signal; a delay unit for delaying the rising edge clock signal based on a first comparison signal in order to generate a first internal clock signal, a second internal clock signal, a first delay locking signal and a second delay locking signal; a duty correction unit for receiving the first and the second internal clock signals and the first and the second delay locking signals to generate a mixed clock signal; a delay model unit for delaying the mixed clock signal to generate a feed-backed clock signal; and a first phase detector for receiving the external clock signal and the feed-backed clock signal to generate the first comparison signal.

26 Claims, 9 Drawing Sheets tCK : clock period tCK : clock period

DELAY LOCKED LOOP AND ITS CONTROL METHOD FOR CORRECTING A DUTY RATIO OF A CLOCK SIGNAL

FIELD OF INVENTION

The present invention relates to a delay locked loop (DLL); and, more particularly, to a DLL and a method for synchronizing an internal clock signal with an external clock signal and for correcting a duty cycle of the internal clock signal.

DESCRIPTION OF PRIOR ART

Generally, a delay locked loop (DLL) is used for a synchronous semiconductor memory device to synchronize an internal clock signal with an external clock signal. In the synchronous semiconductor memory device, data access operations such as a read operation and a write operation are performed in synchronization with clock edges of the external clock signal.

Since there is a time delay while the external clock signal is inputted to the synchronous semiconductor memory device, the DLL is employed for synchronizing the internal clock signal with the external clock signal by compensating the time delay between the internal clock signal and the external clock signal.

However, in case of a double data rate (DDR) synchronous semiconductor memory device, the data access operations are performed at both of a rising edge and a falling edge of the internal clock signal. Therefore, it is required that the internal clock signal have a 50% of duty cycle.

Various techniques of the DLL have been introduced for compensating a skew between the internal clock signal and the external clock signal and for correcting a duty cycle of the internal clock signal.

FIG. 1 is a block diagram showing a conventional DLL disclosed in a commonly owned copending application, U.S. Ser. No. 10/331412, filed on Dec. 30, 2002, entitled "DIGITAL DLL APPARATUS FOR CORRECTING DUTY CYCLE AND METHOD THEREOF".

As shown, the conventional DLL includes a buffer 110, a delay line unit 120, a duty error controller 130, a first delay model unit 140, a first direct phase detector 150, a second delay model unit 160 and a second direct phase detector 170.

The buffer 110 receives an external clock signal ext_clk and generates a first internal clock signal which becomes activated at an edge of the first internal clock signal. The first internal clock signal is inputted to the delay line unit 120.

The delay line unit 120 receives the first internal clock signal and also receives a first and a second detection signals from the first and the second direct phase detectors 150 and 170. The delay line unit 120 delays the first internal clock signal based on the first and the second detection signals and outputs a first delayed internal clock signal intclk1 and a second delayed internal clock signal intclk2 to the duty error controller 130.

In detail, the delay line unit 120 includes a first controller 121, a first delay line 122, a second controller 123 and a second delay line 124.

For controlling a delay amount according to the first detection signal, the first controller 121 outputs a first control signal to the first delay line 122.

The first delay line 122 receives the first control signal and the first internal clock signal. The first internal clock signal is delayed according to the first control signal in the delay line 122. That is, the first delay line 122 generates the first delayed internal clock signal intclk1 by delaying the first internal clock signal according to the first control signal. The first delayed internal clock signal intclk1 is outputted to the duty error controller 130.

For controlling a delay amount according to the second detection signal, the second controller 123 outputs a second control signal to the second delay line 124.

The second delay line 124 receives the second control signal and the first internal clock signal. The second delay line 124 delays the first internal clock signal based on the second control signal. Then, the delayed first internal clock signal is inverted and outputted as the second delayed internal clock signal intclk2. The second delayed internal clock signal intclk2 is outputted to the duty error controller 130.

The duty error controller 130 receives the first and the second internal clock signals intclk1 and intclk2. The duty error controller 130 generates a first duty controlled clock signal int_clk and a second duty controlled clock signal intclk2' by shifting falling edges of the first and the second duty controlled clock signals int_clk and intclk2' to a middle of the falling edges of the first and the second duty controlled clock signals int_clk and intclk2'. Herein, after the first and the second duty controlled clock signals int_clk and intclk2' are duty corrected by shifting their falling edges as above mentioned, they have a 50% duty ratio. The first and the second duty controlled clock signals int_clk and intclk2' are respectively outputted to the first and the second delay model units 140 and 160.

The duty error controller 130 includes a first phase detector 131, a mixer controller 132, a first phase mixer 133 and a second phase mixer 134.

The first and the second delayed internal clock signals intclk1 and intclk2 are inverted and inputted to the first phase detector 131. The first phase detector 131 compares phases of falling edges of the first and the second delayed internal clock signals intclk1 and the intclk2 for determining which one of their falling edges leads the other; and, then, generates a phase detection signal based on the comparison result. The phase detection signal is outputted to the mixer controller 132.

The mixer controller 132 receives the phase detection signal to determine a weight k, which contains a difference between two falling edges of the first and the second delayed internal clock signals intclk1 and intclk2, according to the phase detection signal. The weight k is outputted to the first and the second phase mixers 133 and 134. The weight k includes the plural number of weight signals.

The first phase mixer 133 receives the weight k, the first and the second delayed internal clock signals intclk1 and intclk2. The first phase mixer 133 calculates a difference value by subtracting the weight k from 1. By applying the difference value to the first delayed internal clock signal intclk1 and applying the weight k to the second delayed internal clock signals intclk2, the first phase mixer 133 generates a first duty controlled clock signal int_clk. The first duty controlled clock signal int_clk is outputted to the first delay model unit 140.

The second phase mixer 134 receives the weight k and calculates a difference value by subtracting the weight k from 1. The second phase mixer 134 generates a second duty controlled clock signal intclk2' by applying the weight k to the first delayed internal clock signal intclk1 and applying the difference value to the second delayed internal clock signal intclk2. The second phase mixer 134 outputs the second duty controlled clock signal intclk2' to the second delay model unit 160.

Herein, as mentioned above, the first and the second duty controlled clock signals int_clk and intclk2' are generated by shifting their falling edges to a middle of their falling edges; and a direction and a amount of the shift is determined by the weight k and the difference value.

The first delay model unit 140 receives the first duty controlled clock signal int_clk and estimates a delay amount generated while the external clock signal ext_clk is passed through the conventional DLL to be outputted as the first and the second duty controlled clock signals int_clk and intclk2'. The first delay model unit 140 generates a first compensated clock signal iclk1 based on the estimated delay amount and outputs the first compensated clock signal iclk1 to the first direct phase detector 150.

The first direct phase detector 150 receives the external clock signal ext_clk and generates the first detection signal by comparing the external clock signal ext_clk with the first compensated clock signal iclk1. The first direct phase detector 150 outputs the first detection signal to the delay line unit 120.

The second delay model unit 160 receives the second duty controlled clock signal intclk2' and estimates a delay amount generated while the second duty controlled clock signal intclk2' travels to a data input/output pin (DQ pin). The second delay model unit 160 generates a second compensated clock signal iclk2 based on the estimated delay amount and outputs the second compensated clock signal iclk2 to the second direct phase detector 170.

The second direct phase detector 170 receives the external clock signal ext_clk and generates the second detection signal by comparing the external clock signal ext_clk and the second compensated clock signal iclk2. The second direct phase detector 170 outputs the second detection signal to the delay line unit 120.

The conventional DLL includes two phase mixers, two delay model units and two direct phase detectors connected to two delay lines.

However, each of the phase mixer, the delay model unit and the direct phase detector has a large size and consumes lots of power in a semiconductor memory device. Therefore, the conventional DLL is not suitable to make a small-sized and low power-consumed semiconductor memory device.

In addition, one of the two phase mixers, one of the two delay model units and one of the two direct phase detectors should respectively have same delay amounts as those of the other phase mixer, the other delay model unit and the other direct phase detector regardless of a manufacturing process, a temperature and a voltage. However, since the two phase mixers, the two delay model units and the direct phase detectors are located in different areas, it is difficult to match delay amount with the other.

SUMMARY OF THE INVENTION

It is, therefore, an object of the present invention to provide a DLL which has a small size and consumes low power.

In accordance with an aspect of the present invention, there is provided a delay locked loop (DLL) capable of correcting a duty ratio including: a clock buffer for receiving an external clock signal and an inverted external clock signal to generate a rising edge clock signal; a delay unit for delaying the rising edge clock signal based on a first comparison signal in order to generate a first internal clock signal, a second internal clock signal, a first delay locking signal and a second delay locking signal; a duty correction unit for receiving the first and the second internal clock signals and the first and the second delay locking signals to generate a mixed clock signal; a delay model unit for delaying the mixed clock signal to generate a feed-backed clock signal; and a first phase detector for receiving the external clock signal and the feed-backed clock signal to generate the first comparison signal.

In accordance with another aspect of the present invention, there is provided a method for correcting a duty ratio of a clock signal in a DLL including steps of: initializing the DLL, which includes a first delay line and a second delay line connected in series for receiving an external clock signal, and enabling the first delay line for generating a first internal clock signal; passing the first internal clock signal through a feed-back loop for generating a feed-backed clock signal and comparing the feed-backed clock signal with the external clock signal until rising edges of the external clock signal and the feed-backed clock signal are synchronized; enabling the second delay line for generating a second internal clock signal if the rising edges of the external clock signal and the feed-backed clock signal are synchronized; passing the second internal clock signal through the feed-back loop for generating the feed-backed clock signal and comparing the feed-backed clock signal with the external clock signal until rising edges of the external clock signal and the feed-backed clock signal are synchronized; and performing a phase mixing operation on the first and second interval clocks if the rising edges of the external clock signal and the feed-backed clock signal are synchronized.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a delay locked loop (DLL) for use in a semiconductor memory device in accordance with the present invention will be described in detail referring to the accompanying drawings.

Figure 1:
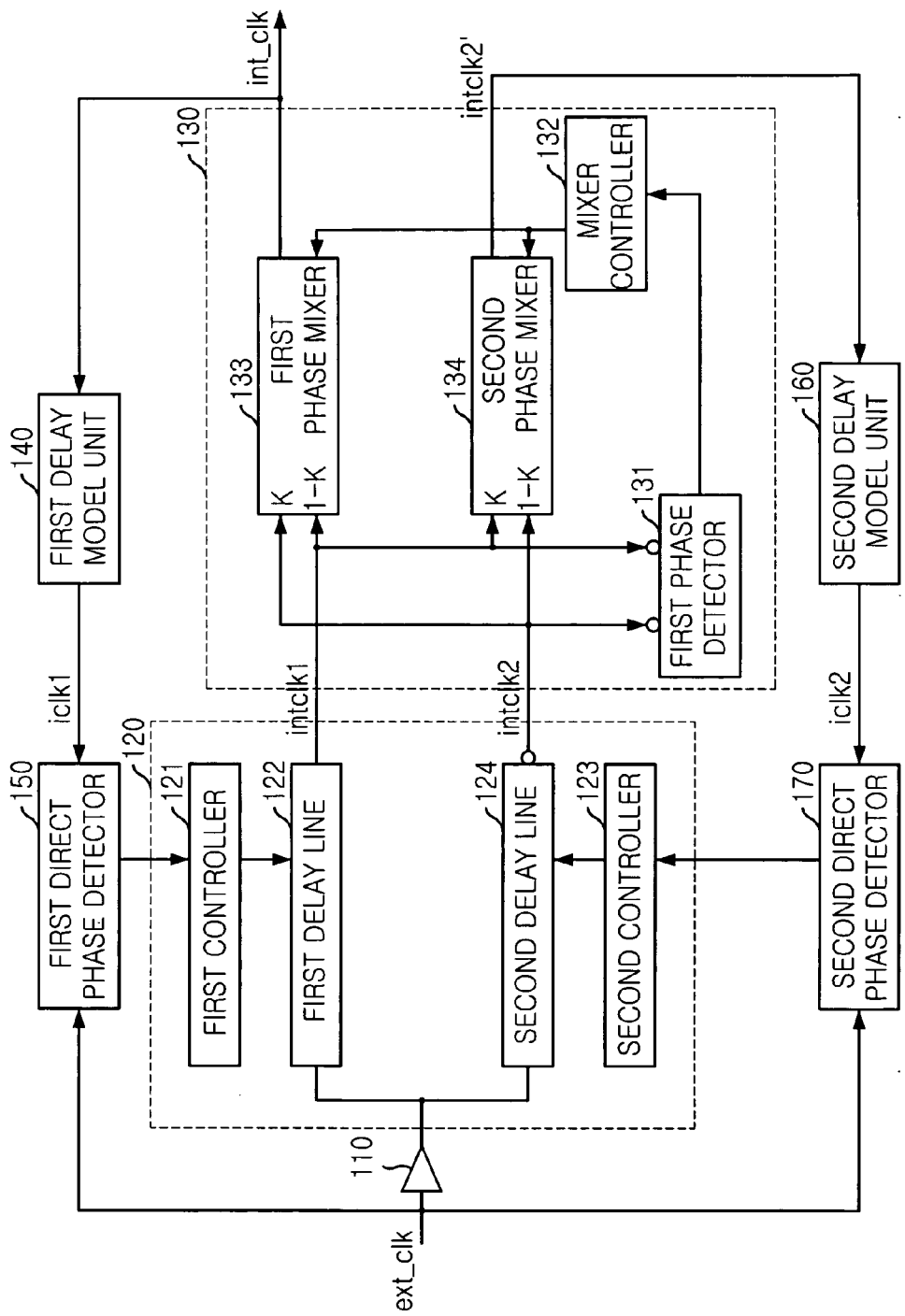
FIG. 1 is a block diagram showing a conventional DLL.
Figure 2:
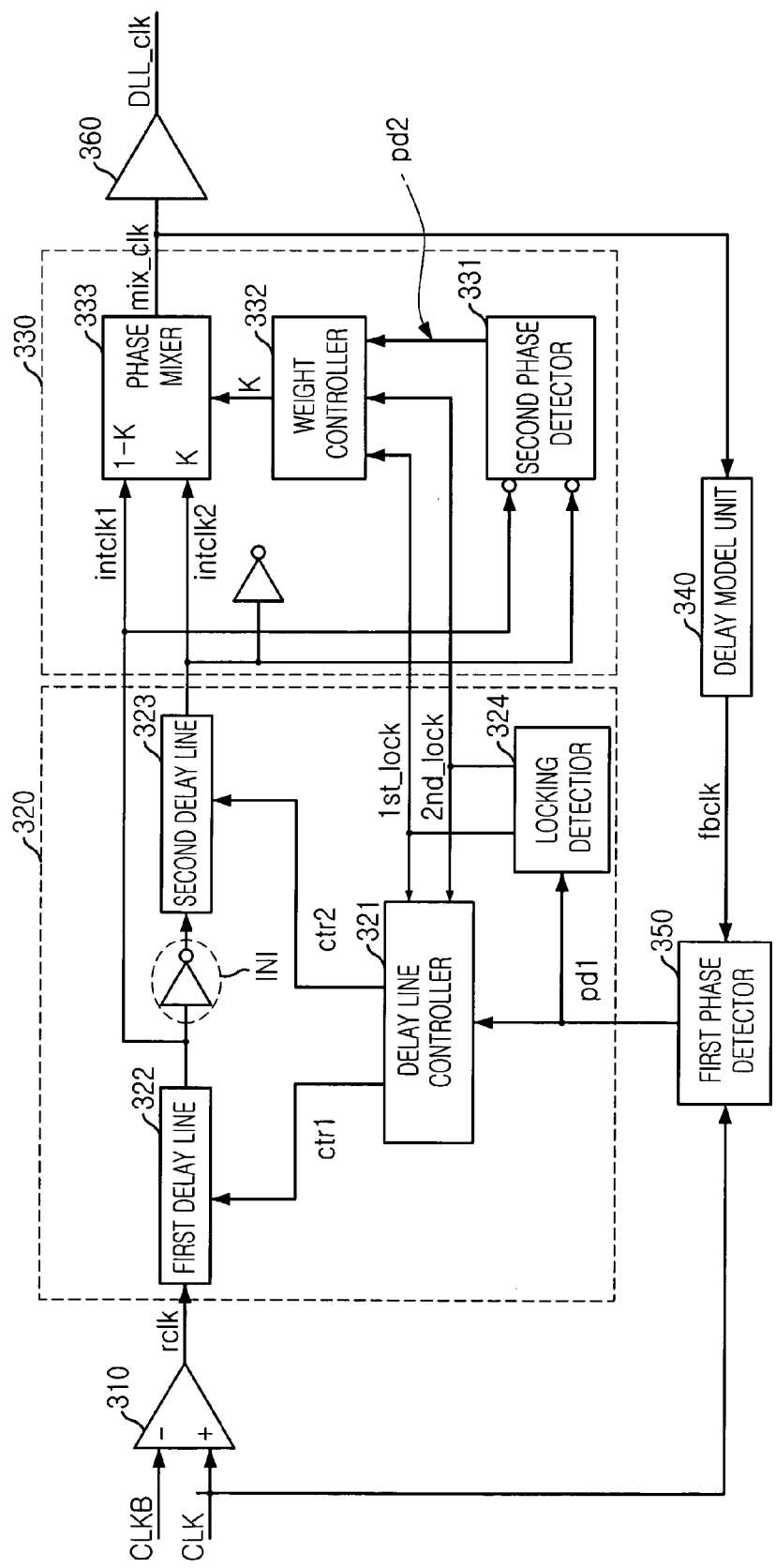
FIG. 2 is block diagram showing a DLL in accordance with a first embodiment of the present invention.

FIG. 2 is block diagram showing a DLL in accordance with a first embodiment of the present invention.

As shown, the DLL includes a first clock buffer 310, a delay line unit 320, a control unit 300, a delay model unit 340, a first phase detector 350 and a second clock buffer 360.

The first clock buffer 310 receives an external clock signal CLK and its inverted signal, namely an external clock bar signal CLKB to output a rising edge clock signal rclk by buffering the external clock signal CLK and the external clock bar signal CLKB.

The delay line unit 320 receives the rising edge clock signal rclk and a first comparison signal pd1 to output a first internal clock signal intclk1, a second internal clock signal intclk2, a first delay locking signal 1st_lock and a second delay locking signal 2nd_lock.

The delay line unit 320 includes a first delay line 322, a second delay line 323, a delay line controller 321 and a locking detector 324.

The delay line controller 321 receives the first comparison signal pd1, the first delay locking signal 1st_lock and the second delay locking signal 2nd_lock in order to generate a first delay line control signal ctr1 and a second delay line control signal ctr2. The first and the second delay line control signals ctr1 and ctr2 are respectively used for controlling delay amounts of the first and the second delay lines 322 and 323.

The first delay line 322 receives the rising edge clock signal rclk in order to generate the first internal clock signal intclk1 by delaying the rising edge clock signal for a first predetermined delay time according to the first delay line control signal ctr1.

The first internal clock signal intclk1 is inputted to a duty inverter IN1 to be inverted by the duty inverter IN1. The second delay line 323 receives the inverted first internal clock signal intclk1 from the duty inverter IN1 and delays the received signal for a second predetermined delay time according to the second delay line control signal ctr2 to thereby generate the second internal clock signal intclk2.

The locking detector 324 receives the first comparison signal pd1 to determine whether or not the first and the second internal clock signals intclk1 and intclk2 are delay locked in order to generate the first and the second delay locking signals 1st_lock and 2nd_lock.

The control unit 330 receives the first and the second internal clock signals intclk1 and intclk2, the first and the second delay locking signals 1st_lock and 2nd_lock from the delay line unit 320 to thereby generate a mixed clock signal mix_clk by mixing phases of the first and the second internal clock signals intclk1 and intclk2. Herein, the control unit 330 compares a phase of the first internal clock signal intclk1 to a phase of the second internal clock signal intlck2 and applies weight values 1−K and K to the first and the second internal clock signals intclk1 and intclk2 respectively based on the comparison result in order to correct duties of the first and the second internal clock signals intclk1 and intclk2.

The control unit 330 includes a phase mixer 333, a weight controller 332 and a second phase detector 331.

The second phase detector 331 receives inverted signals of the first and the second internal clock signals intclk1 and intclk2 and determines whose phase of the received two signals leads to thereby output a second comparison signal pd2.

The weight controller 332 controls the weight values 1−K and K based on the first delay locking signal 1st_lock, the second delay locking signal 2nd_lock and the second comparison signal pd2. Herein, the weight value K is equal to or greater than 0, and is equal to or smaller than 1.

The delay model unit 340 receives the mixed clock signal mix_clk from the control unit 300 and delays the mixed clock signal mix_clk for a third predetermined delay time in order to output the delayed signal as a feed-backed clock signal fbclk. Herein, the third predetermined delay time is equal to a delay time taken while the external clock signal CLK is passed through the DLL.

The first phase detector 350 receives the external clock signal CLK and the feed-backed clock signal fbclk, and compares phases of the external clock signal CLK and the feed-backed clock signal fbclk to thereby generate the first comparison signal pd1.

The second clock buffer 360 receives and buffers the mixed clock signal mix_clk in order to output the buffered signal as a delay-locked clock signal DLL_clk.

Figure 3:
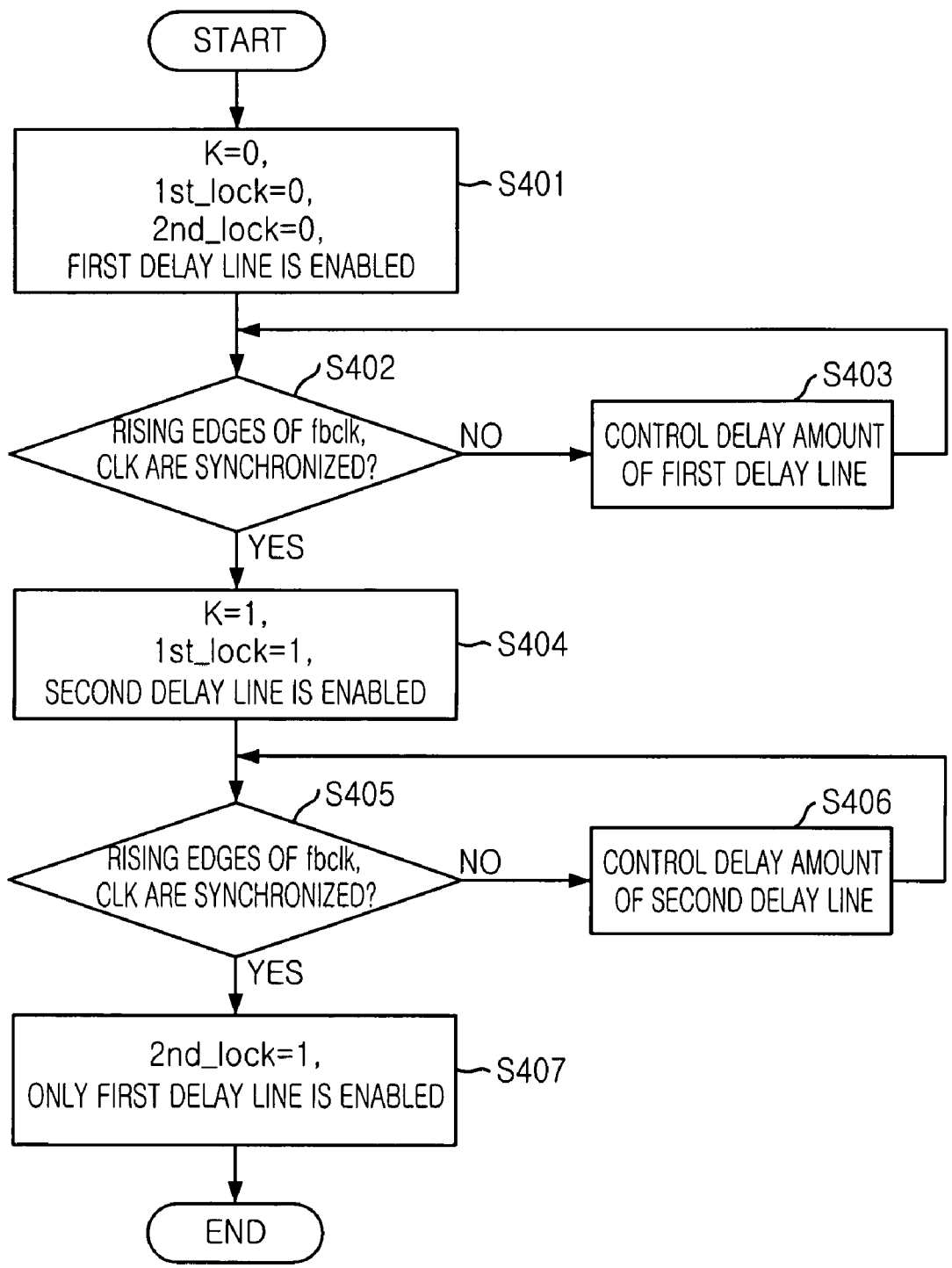
FIG. 3 is a flow chart showing an operation of a DLL shown in FIG. 2.

FIG. 3 is a flow chart showing an operation of the DLL shown in FIG. 2.

When the DLL is initialized, both of the first and the second delay locking signal 1st_lock and 2nd_lock are in a logic low level, and the weight controller sets the weight value K to 0 at a step 401. Since the weight value is 0, the phase mixer 333 receives only the first internal clock signal intclk1 in order to output the received signal as the mixed clock signal mix_clk. The delay line controller 321 controls only the first delay line 322.

Next, the first phase detector 350 compares phases of the external clock signal CLK and the feed-backed clock signal fbclk in order to find whether or not rising edges of the external clock signal CLK and the feed-backed clock signal fbclk are synchronized at a step 402.

If the rising edges of the external clock signal CLK and the feed-backed clock signal fbclk are not in phase, a delay amount of the first delay line 322 is adjusted by the delay line controller 321 until the rising edges of the external clock signal CLK and the feed-backed clock signal fbclk are synchronized at a step 403.

Next, if the rising edges of the external clock signal CLK and the feed-backed clock signal fbclk are in phase, i.e., if the first internal clock signal intclk1 is delay-locked, the locking detector 324 sets the first delay locking signal 1st_lock as a logic high level at a step 404. At the step 404, the weight controller 332 sets the weight value K to 1. Therefore, the phase mixer 333 receives only the second internal clock signal intclk2 in order to output the received signal as the mixed clock signal mix_clk. Herein, the delay line controller 321 controls only the second delay line 323.

Next, at a step 405, the first phase detector 350 compares phases of the external clock signal CLK and the feed-backed clock signal fbclk in order to find whether or not rising edges of the external clock signal CLK and the feed-backed clock signal fbclk are synchronized.

If the rising edges of the external clock signal CLK and the feed-backed clock signal fbclk are not in phase, a delay amount of the second delay line 323 is adjusted by the delay line controller 321 until the rising edges of the external clock signal CLK and the feed-backed clock signal fbclk are in phase at a step 406.

Next, at a step 407, if the rising edges of the external clock signal CLK and the feed-backed clock signal fbclk are in phase, i.e., the second internal clock signal intclk2 is delay-locked, the locking detector 324 sets the second delay locking signal 2nd_lock as a logic high level. Herein, the delay line controller 321 controls only the first delay line 322 by using the first delay line control signal ctr1, and does not adjust a delay amount of the second delay line 323.

Since the second delay line 323 uses an inverted signal of the first internal clock signal intclk1 outputted from the first delay line 322 in order to generate the second internal clock signal intclk2, a phase of the second internal clock signal intclk2 can be adjusted by controlling the first delay line 322 under the condition that rising edges of the first and the second internal clock signals intclk1 and intclk2 are in phase. Herein, since each phase of the first and the second internal clock signal intclk1 and intclk2 is in phase with a phase of the external clock signal CLK, phases of the first and the second internal clock signal intclk1 and intclk2 are in phase.

Figure 4:
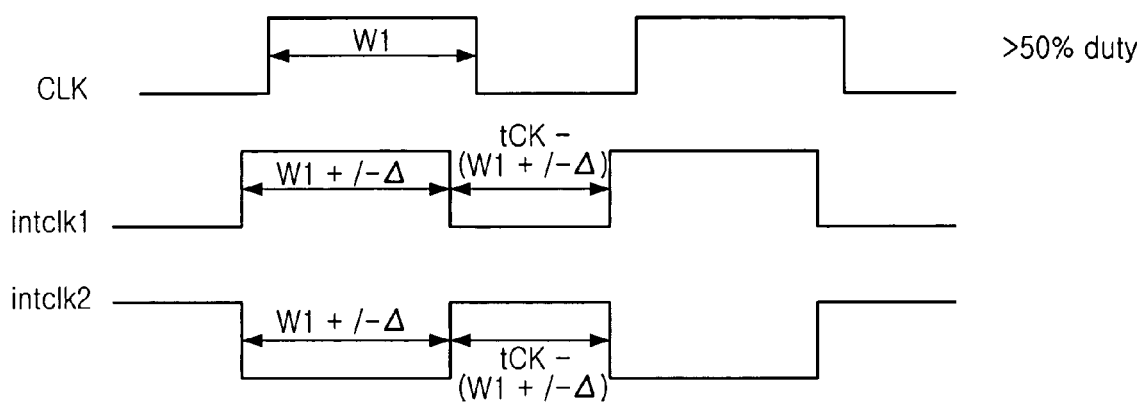
FIG. 4 is a wave graph showing phases of clock signals.

FIG. 4 is a wave graph showing phases of the external clock signal CLK, the first internal clock signal intclk1 and the second internal clock signal intclk2 at the step 404.

When the first internal clock signal intclk1 is delay-locked, and a delay amount of the second internal clock signal intclk2 starts to be adjusted, phases of the first and the second internal clock signals intclk1 and intclk2 are opposite because the second delay line 323 receives an inverted signal of the first internal clock signal 322.

Herein, the second internal clock signal intclk2 can be delay-locked by delaying the second internal clock signal intclk2 by delay amount of tCK/2. Herein, the tCK is a clock period of the external clock signal CLK. Therefore, the second delay line 323 has unit delays each of which has a delay amount of tCK/2.

Figure 5:
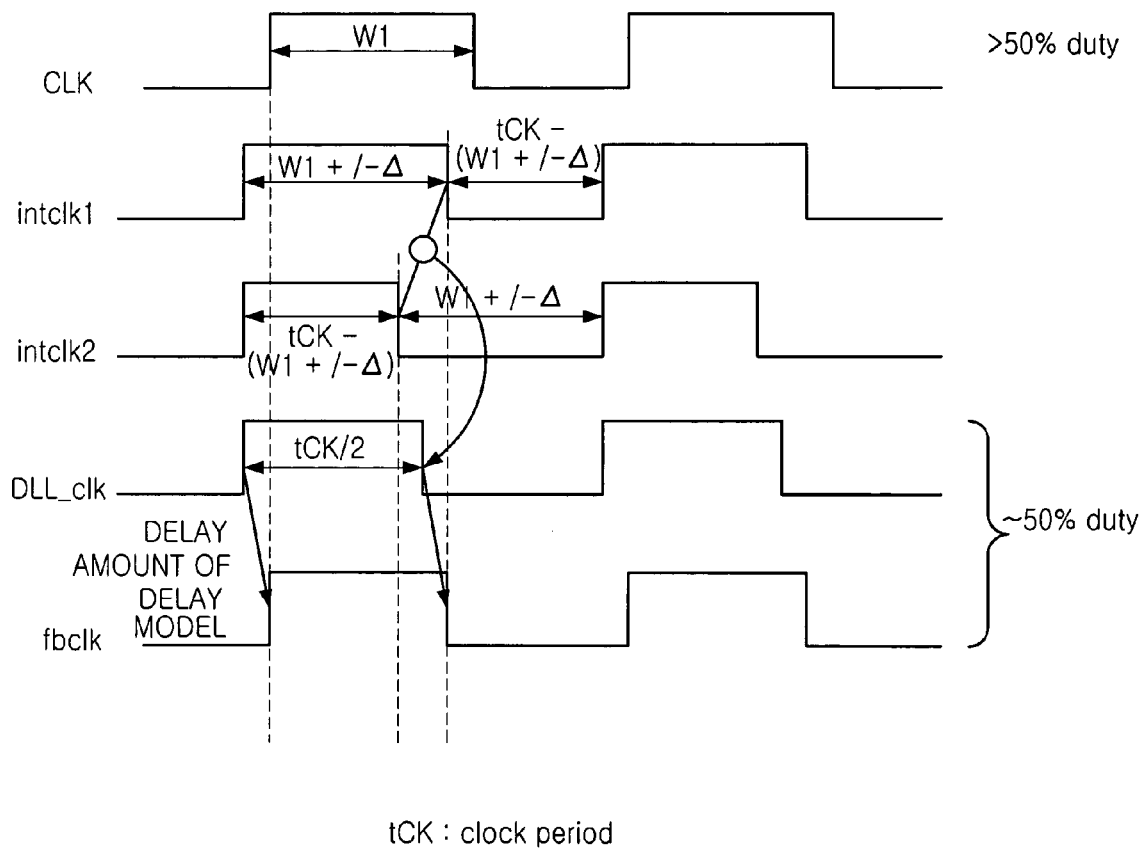
FIG. 5 is a wave graph showing a duty correction operation.

FIG. 5 is a wave graph showing a duty correction operation which is performed after delay-locking the first and the second internal clock signals intclk1 and intclk2.

The delay line controller 321 controls both of the first and the second delay lines 322 and 323, and the weight controller 332 determines the weight value K based on the second comparison signal pd2, the first delay locking signal 1st_lock and the second delay locking signal 2nd_lock.

The second phase detector 331 decides which one of two falling edges of the first and the second internal clock signals intclk1 and intclk2 leads the other. If a falling edge of the first internal clock signal intclk1 leads a falling edge of the second internal clock signal intclk2, the second comparison signal pd2 becomes in a logic high level. On the other hand, if a falling edge of the second internal clock signal intclk2 leads a falling edge of the first internal clock signal intclk1, the second comparison signal pd2 becomes in a logic low level.

When both of the first and the second delay locking signals 1st_lock and 2nd_lock are in a logic high level, the weight controller 332 finally determines the weight value K based on the second comparison signal pd2.

Herein, when both of the first and the second delay locking signals 1st_lock and 2nd_lock are in a logic high level, i.e., when the first and the second internal clock signals intclk1 and intclk2 are delay-locked, rising edges of the first and the second internal clock signals intclk1 and intclk2 are synchronized, but their falling edges are not synchronized having a time difference of a duty error which the external clock signal CLK has.

Thereafter, the phase mixer 333 performs a phase mixing operation on the first and the second internal clock signals intclk1 and intclk2 to thereby generate the mixed clock signal mix_clk. Since rising edges of the first and the second internal clock signals intclk1 and intclk2 are synchronized, a rising edge of the mixed clock signal mix_clk is synchronized with rising edges of the first and the second internal clock signals intclk1 and intclk2.

However, falling edges of the first and the second internal clock signals intclk1 and intclk2 are not synchronized each other. Therefore, to generate the mixed clock signal mix_clk which has a 50% duty, a middle phase between falling edges of the first and the second internal clock signals intclk1 and intclk2 should be found by performing the phase mixing operation. The symbol Δ shown in FIG. 5 is a duty variation which can be generated while the external clock signal CLK is passed through the first and the second delay lines 322 and 323.

Generally, to find a middle phase between rising edges or falling edges of two clock signals, a phase mixer provides a greater weight value to one of the two signals whose phase leads the other.

That is, when both of the first and the second delay locking signals 1st_lock and 2nd_lock are in a logic high level, the weight controller 332 provides a greater weight value to one of the first and the second internal clock signals intclk1 and intclk2 whose phase leads the other based on the second comparison signal pd2.

The second phase detector 331 compares two falling edges of the first and the second internal clock signal intclk1 and intclk2 in order to determine which falling edge leads the other between the two falling edges, and generates the second comparison signal pd2 based on the resultant of the comparison.

Figure 6:
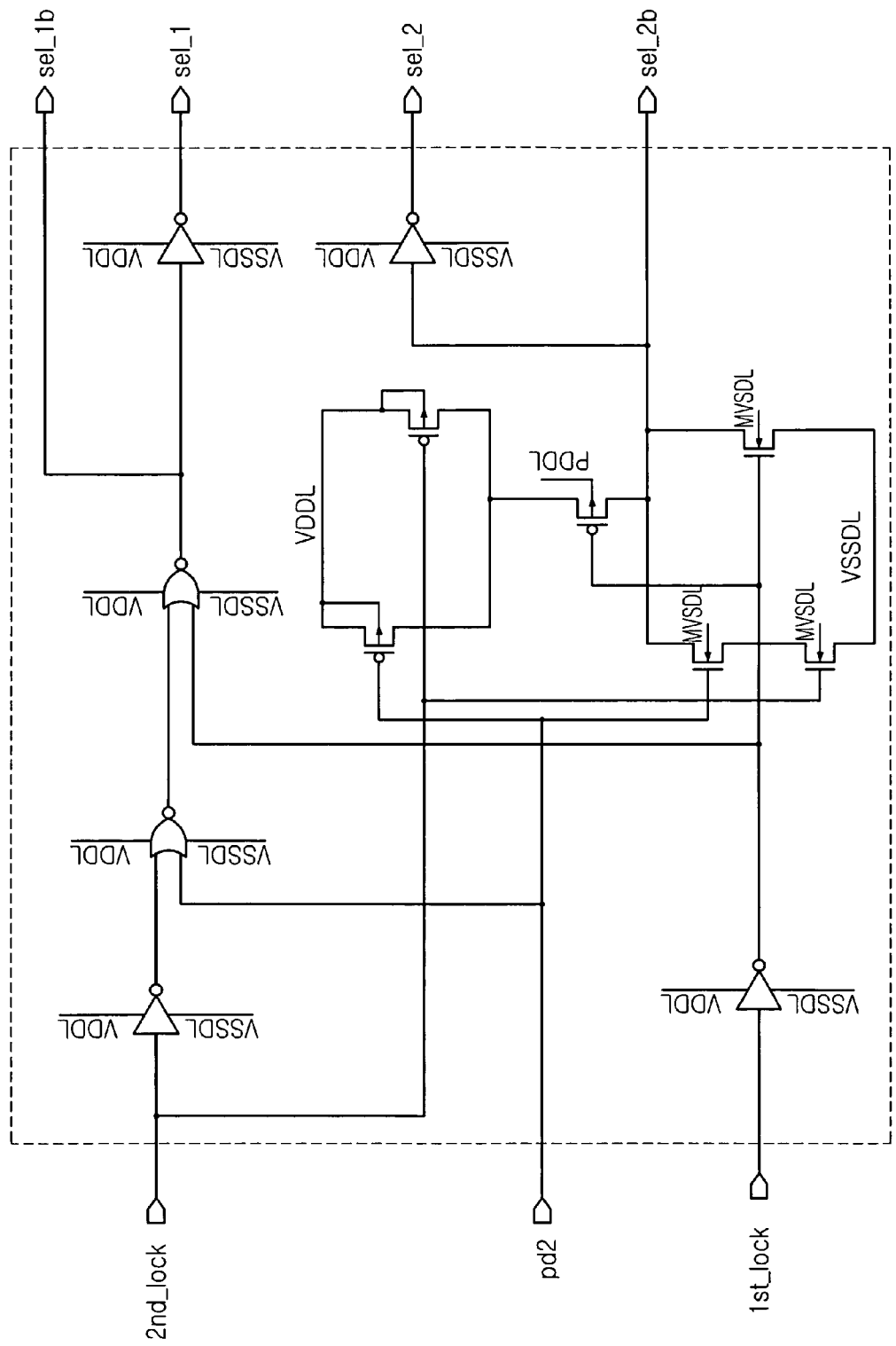
FIG. 6 is a schematic circuit diagram showing a weight controller shown in FIG. 2.

FIG. 6 is a schematic circuit diagram showing the weight controller 332.

As shown, the weight controller 332 receives the second comparison signal pd2, the first delay locking signal 1st_lock and the third delay locking signal 2nd_lock to generate a first selection signal sel_1, a second selection signal sel_2, a first selection bar signal sel_1b and a second selection bar signal sel_2b. Herein, each of the first and the second selection signals sel_1 and sel_2, and the first and the second selection bar signals sel_1b and sel_2b is in a logic high level or a logic low level depending on logic states of the second comparison signal pd2, the first and the second delay locking signals 1st_lock and 2nd_lock.

The weight value K is determined by logic states of the first and the second selection signals sel_1 and sel_2, and the first and the second selection bar signals sel_1b and sel_2b.

For example, if the first and the second selection signals sel_1 and sel_2 are in a logic high level, and the first and the second selection bar signals sel_1b and sel_2b are in a logic low level, the weight value K is set to 0.

An operation of the weight controller 332 is described below referring to FIGS. 3 to 7.

In a first case I, at an initial state, when the first and the second delay locking signals 1st_lock and 2nd_lock are in a logic low level, the first and the second selection signals sel_1 and sel_2 are in a logic high level, and the first and the second selection bar signals sel_1b and sel_2b are in a logic low level. In this case, the weight controller 332 sets the weight value K to 0 according to logic states of the first and the second selection signals sel_1 and sel_2, and the first and the second selection bar signals sel_1b and sel_2b.

In a second case II, when the first delay locking signal 1st_lock is in a logic high level and the second delay locking signal 2nd_lock is in a logic low level, the first and the second selection signals sel_1 and sel_2 are in a logic low level, and the first and the second selection bar signals sel_1b and sel_2b are in a logic high level. In this case, the weight controller 332 sets the weight value K to 1 according to logic states of the first and the second selection signals sel_1 and sel_2, and the first and the second selection bar signals sel_1b and sel_2b.

In a third case III, when both of the first and the second delay locking signals 1st_lock and 2nd_lock are in a logic high level, i.e., when rising edges of the first and the second internal clock signals intclk1 and intclk2 are synchronized, the weight value K is determined by a logic state of the second comparison signal pd2.

In this case, if the second comparison signal pd2 is in a logic high level, i.e., if a falling edge of the first internal clock signal intclk1 leads a falling edge of the second internal clock signal intclk2, the first selection signal sel_1 and the second selection bar signal sel_2b are in a logic low level, and the second selection signal sel_2 and the first selection bar signal sel_1b are in a logic high level. As a result, the weight controller 332 sets the weight value K to 1/3 according to logic state of the first and the second selection signals sel_1 and sel_2, and the first and the second selection bar signals sel_1b and sel_2b.

On the other hand, if the second comparison signal pd2 is in a logic low level, i.e., if a falling edge of the first internal clock signal intclk1 lags behind a falling edge of the second internal clock signal intclk2, the first selection signal sel_1 and the second selection bar signal sel_2b are in a logic high level, and the second selection signal sel_2 and the first selection bar signal sel_1b are in a logic low level. As a result, the weight controller 332 sets the weight value K to 2/3 according to logic state of the first and the second selection signal sel_1 and sel_2, and the first and the second selection bar signal sel_1b and sel_2b.

TABLE 1

|     | 1st_lock | 2nd_lock | pd2 | sel_1 | sel_2 | sel_1b | sel_2b | K   |
| --- | -------- | -------- | --- | ----- | ----- | ------ | ------ | --- |
| I   | L        | L        |     | H     | H     | L      | L      | 0   |
| II  | H        | L        |     | L     | L     | H      | H      | 1   |
| III | H        | H        | H   | L     | H     | H      | L      | ⅓   |
|     | H        | H        | L   | H     | L     | L      | H      | ⅔   |

Table. 1 briefly shows the operation of the weight controller 332 described above.

Figure 7:
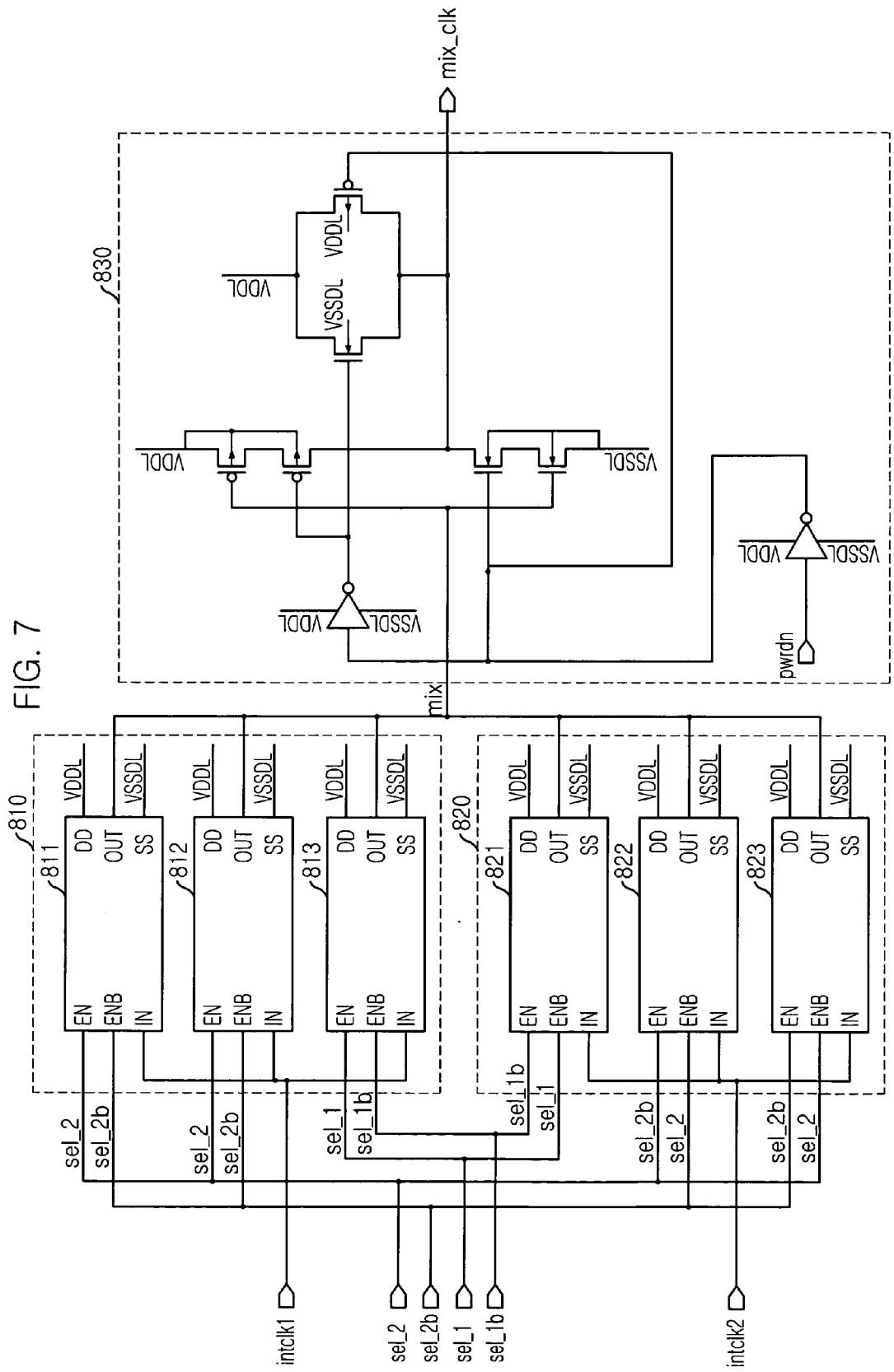
FIG. 7 is a schematic circuit diagram showing a phase mixer shown in FIG. 2.

FIG. 7 is a schematic circuit diagram showing the phase mixer 333 shown in FIG. 2.

As shown, the phase mixer 333 includes a first phase selector 810, a second phase selector 820 and an output controller 830.

The first and the second internal clock signals intclk1 and intclk2 are respectively inputted to the first and the second phase selectors 810 and 820. Each of the first and the second phase selectors 810 and 820 includes a plurality of unit phase mixers 811 to 813 and 821 to 823. Herein, the number of unit phase mixers included in each of the first and the second phase selectors 810 and 820 can be larger than three to adjust the weight value K more minutely.

Each of the unit phase mixers 811, 812, 822 and 823 receives the second selection signal sel_2 and the second selection bar signal sel_2b; and each of the unit phase mixers 813 and 821 receives the first selection signal sel_1 and the first selection bar signal sel_1b.

When rising edges of the first and the second internal clock signals intclk1 and intclk2 are synchronized, and a falling edge of the first internal clock signal intclk1 lags behind that of the second internal clock signal intclk2, the first selection signal sel_1 and the second selection bar signal sel_2b are in a logic high level, and the first selection bar signal sel_1b and the second selection signal sel_2 are in a logic low level. Therefore, the unit phase mixers 813, 822 and 823 are enabled. At this time, the enabled unit phase mixers 813, 822 and 823 are operated as inverters, then, a weight of 1/3 is applied to the first internal clock signal intclk1 and a weight of 2/3 is applied to the second internal clock signal intclk2.

That is, since a falling edge of the second internal clock signal intclk2 leads that of the first internal clock signal intclk1, more unit phase mixers of the second phase selector 820 are enabled than that of the first phase selector 810 in order to apply a more weight to the second internal clock signal intclk2 than to the first clock signal intclk1. Therefore, a middle phase between falling edges of the first and the second internal clock signals intclk1 and intclk2 can be found.

Meanwhile, a weight value close to 0.5 can be generated by controlling size of a transistor included in each of the unit phase mixers 811 to 813 and 821 to 823.

The output controller 830 does not output the mixed clock signal mix_clk based on a power down mode signal pwrdn when the semiconductor memory device is in power down mode in order to reduce power consumption. Herein, the power down mode signal pwrdn is activated as a logic high level when the semiconductor memory device is in the power down mode.

Figure 8:
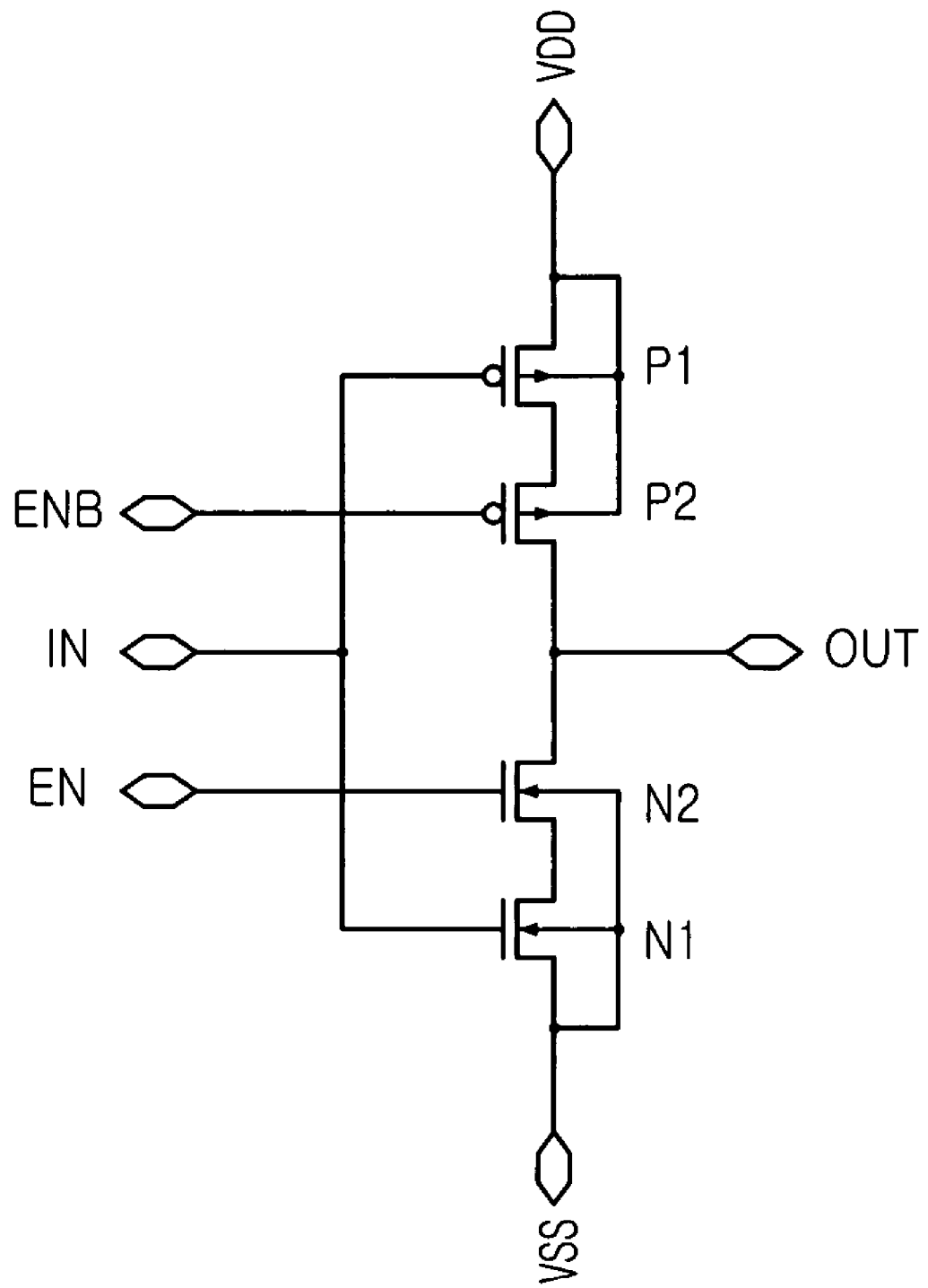
FIG. 8 is a schematic circuit diagram showing unit phase mixers shown in FIG. 2.

FIG. 8 is a schematic circuit diagram showing the unit phase mixers 811 to 813 and 821 to 823.

As shown, each of the unit phase mixers 811 to 813 and 821 to 823 includes a first and a second p-channel metal oxide semiconductor (PMOS) transistors P1 and P2, and also includes a first and a second n-channel metal oxide semiconductor (NMOS) transistors N1 and N2.

The first PMOS transistor P1 is connected between a power supply voltage VDD and the second PMOS transistor P2, and a gate of the first PMOS transistor P1 receives one of the first and the second internal clock signals intclk1 and intclk2.

The second PMOS transistor P2 is connected between the first PMOS transistor P1 and the second NMOS transistor N2, and a gate of the second PMOS transistor P2 receives one of the first and the second selection signals sel_1 and sel_2 and the first and the second selection bar signals sel_1b and sel_2b.

The first NMOS transistor N1 is connected between the second NMOS transistor N2 and a ground voltage VSS, and a gate of the first NMOS transistor N1 receives one of the first and the second internal clock signals intclk1 and intclk2.

The second NMOS transistor N2 is connected between the second PMOS transistor P2 and the first NMOS transistor N1, and a gate of the second NMOS transistor N2 receives one of the first and the second selection signals sel_1 and sel_2 and the first and the second selection bar signals sel_1b and sel_2b.

Figure 9:
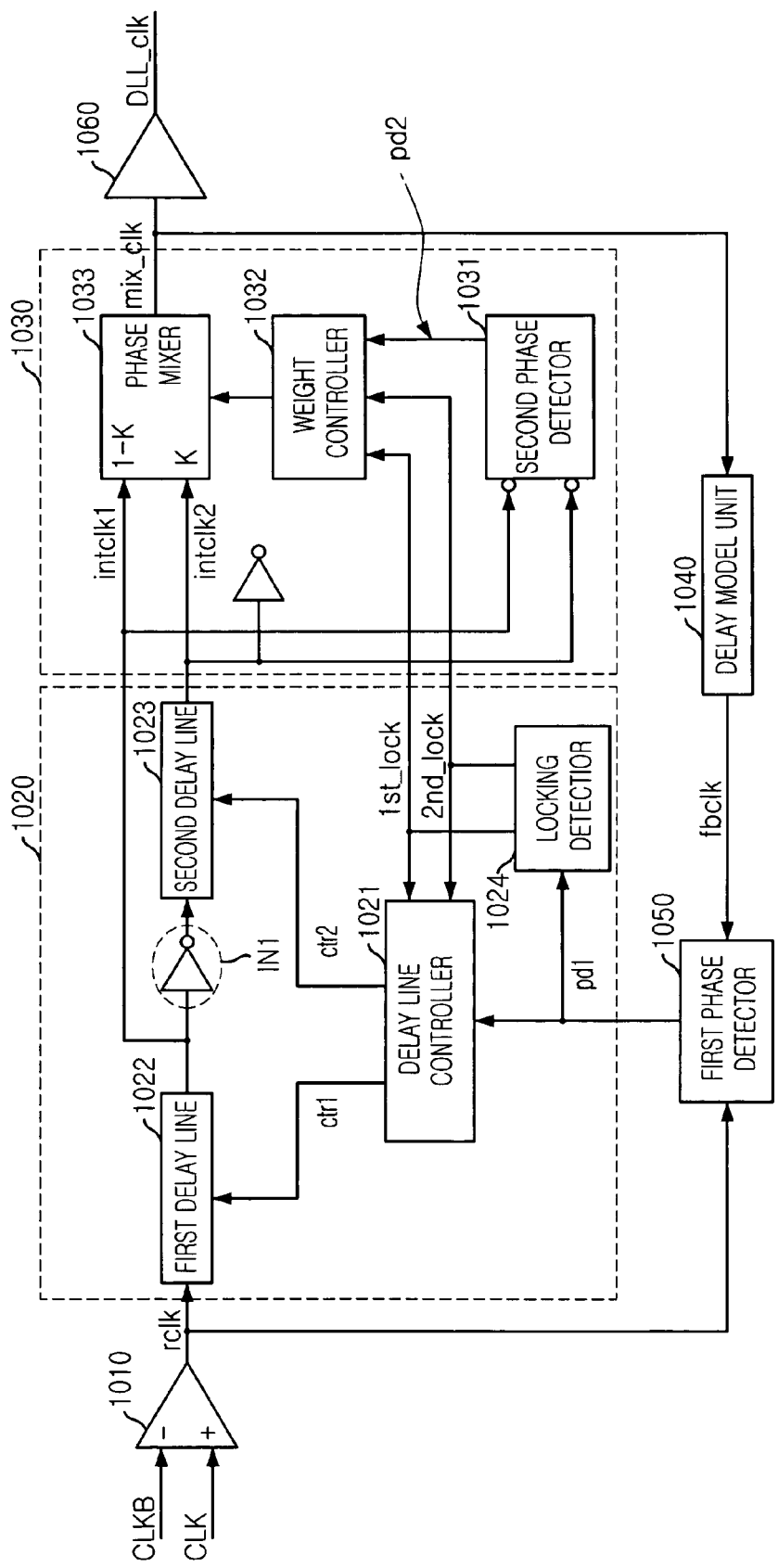
FIG. 9 is a block diagram showing a DLL in accordance with a second embodiment of the present invention.

FIG. 9 is a block diagram showing a DLL in accordance with a second embodiment of the present invention.

As shown, the DLL in accordance with the second embodiment includes a first clock buffer 1010, a delay line unit 1020, a control unit 1030, a delay model unit 1040, a first phase detector 1050 and a second clock buffer 1060.

The first clock buffer 1010 receives an external clock signal CLK and its inverted signal, namely an external clock bar signal CLKB to output a rising edge clock signal rclk by buffering the external clock signal CLK and the external clock bar signal CLKB.

The delay line unit 1020 receives the rising edge clock signal rclk and a first comparison signal pd1 to output a first internal clock signal intclk1, a second internal clock signal intclk2, a first delay locking signal 1st_lock and a second delay locking signal 2nd_lock.

The delay line unit 1020 includes a first delay line 1022, a second delay line 1023, a delay line controller 1021 and a locking detector 1024.

The delay line controller 1021 receives the first comparison signal pd1, the first delay locking signal 1st_lock and the second delay locking signal 2nd_lock in order to generate a first delay line control signal ctr1 and a second delay line control signal ctr2. The first and the second delay line control signals ctr1 and ctr2 are respectively used for controlling delay amounts of the first and the second delay lines 1022 and 1023.

The first delay line 1022 receives the rising edge clock signal rclk in order to generate the first internal clock signal intclk1 by delaying the rising edge clock signal rclk for a first predetermined delay time according to the first delay line control signal ctr1.

The first internal clock signal intclk1 is inputted to a duty inverter IN1 to be inverted by the duty inverter IN1. The second delay line 1023 receives the inverted first internal clock signal intclk1 from the duty inverter IN1 and delays the received signal for a second predetermined delay time according to the second delay line control signal ctr2 to generate the second internal clock signal intclk2.

The locking detector 1024 receives the first comparison signal pd1 to determine whether or not the first and the second internal clock signals intclk1 and intclk2 are delay locked in order to generate the first and the second delay locking signals 1st_lock and 2nd_lock.

The control unit 1030 receives the first and the second internal clock signals intclk1 and intclk2, the first and the second delay locking signals 1st_lock and 2nd_lock from the delay line unit 1020 to generate a mixed clock signal mix_clk by mixing phases of the first and the second internal clock signals intclk1 and intclk2. Herein, the control unit 1030 compares a phase of the first internal clock signal intclk1 to a phase of the second internal clock signal intlck2 and applies weight values 1−K and K to the first and the second internal clock signals intclk1 and intclk2 respectively based on the comparison result in order to correct duties of the first and the second internal clock signals intclk1 and intclk2.

The control unit 1030 includes a phase mixer 1033, a weight controller 1032 and a second phase detector 1031.

The second phase detector 1031 receives inverted signals of the first and the second internal clock signals intclk1 and intclk2 and determines whose phase of the received two signals leads in order to output a second comparison signal pd2.

The weight controller 1032 controls the weight values 1−K and K based on the first delay locking signal 1st_lock, the second delay locking signal 2nd_lock and the second comparison signal pd2. Herein, the weight value K is equal to or greater than 0, and is equal to or smaller than 1.

The delay model unit 1040 receives the mixed clock signal mix_clk from the control unit 1030 and delays the mixed clock signal mix_clk for a third predetermined delay time in order to output the delayed signal as a feed-backed clock signal fbclk. Herein, the third predetermined delay time is equal to a delay time taken while the external clock signal CLK is passed through the DLL.

The first phase detector 1050 receives the rising edge clock signal rclk and the feed-backed clock signal fbclk, and compares phases of the rising edge clock signal rclk and the feed-backed clock signal fbclk to generate the first comparison signal pd1.

The second clock buffer 1060 receives and buffers the mixed clock signal mix_clk in order to output the buffered signal as a delay-locked clock signal DLL_clk.

Compared to the DLL shown in FIG. 2, the first phase detector 350 of the DLL shown in FIG. 9 receives the rising edge clock signal rclk not the external clock signal CLK. Therefore, a delay amount of the first clock buffer 1010 should be considered to design the first phase detector 1050, and the delay amount of the first clock buffer 1010 is well known to those who skilled in the art.

As described above, the DLL in accordance with the present invention reduces the number of a delay model unit, a phase detector and a phase mixer, whereby a size of the DLL can be reduced and power consumption of the DLL is also reduced, and the number of a net die can be increased.

In addition, since the conventional DLL includes two feed-back lines where outputted signals from phase mixers are feed-backed to delay models, there can be a delay amount difference between the two feed-back lines. As a result, an error is easily occurred during correcting a duty ratio of a clock signal due to the delay amount difference. However, the DLL in accordance with the present invention uses a single feed-back line where an outputted signal from a phase mixer is feed-backed to a delay line. Therefore, the DLL can correct a duty ratio more accurately.

The present application contains subject matter related to Korean patent application No. 2003-82570, filed in the Korean Patent Office on Nov. 20, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) capable of correcting a duty ratio of a clock signal comprising:
    a clock buffer for receiving an external clock signal and an inverted external clock signal to generate a rising edge clock signal by buffering the external clock signal and the inverted external clock signal;
    a delay means for delaying the rising edge clock signal based on a first comparison signal in order to generate a first internal clock signal and a second internal clock signal and generating a first delay locking signal and a second delay locking signal based on the first comparison signal;
    a duty correction means for receiving the first and the second internal clock signals and the first and the second delay locking signals to generate a mixed clock signal which is duty corrected by mixing phases of the first and the second internal clock signals applying a first weight and a second weight to the first and the second internal clock signals respectively;
    a delay model unit for delaying the mixed clock signal for a predetermined delay time to generate a feed-backed clock signal; and
    a first phase detector for receiving the external clock signal and the feed-backed clock signal to generate the first comparison signal by comparing phases of the external clock signal and the feed-backed clock signal.

2. The DLL as recited in claim 1, wherein the delay means includes:
    a delay line controller which receives the first comparison signal and the first and the second delay locking signals to generate a first delay line control signal and a second delay line control signal;
    a first delay line which receives the rising edge clock signal and delays the rising edge clock signal based on the first delay line control signal in order to generate the first internal clock signal;
    a second delay line which receives an inverted signal of the first internal clock signal and delays the inverted signal based on the second delay line control signal in order to generate the second internal clock signal; and a locking detector which receives the first comparison signal and determines whether or not the first and the second delay lines are delay locked based on the first comparison signal in order to generate the first and the second delay locking signal.

3. The DLL as recited in claim 2, wherein the duty correction means includes:
a second phase detector which receives inverted signals of the first and the second internal clock signals and determines which one of falling edges of the received signals leads the other in order to generate a second comparison signal;
a weight controller which receives the second comparison signal and the first and the second delay locking signals in order to generate a weight value; and
a phase mixer which receives the first and the second internal clock signals to generate the mixed clock signals by mixing phases applying the weight value to the second internal clock signal and a second weight value to the first internal clock signal, wherein the second weight value is a value of subtracting the weight value from 1.

4. The DLL as recited in claim 3, wherein the weight value includes a first selection signal, a second selection signal, a first selection bar signal and a second selection bar signal.

5. The DLL as recited in claim 4, wherein the weight controller makes the first and the second selection signals be in a second logic level and makes the first and the second selection bar signals be in a first logic level when the first and the second delay locking signals are in a first logic level.

6. The DLL as recited in claim 4, wherein the weight controller makes the first and the second selection signals be in a first logic level and makes the first and the second selection bar signals be in a second logic level when the first delay locking signal is in a second logic level and the second delay locking signal is in a first logic level.

7. The DLL as recited in claim 4, wherein the weight controller makes the first selection signal and the second selection bar signal be in a first logic level and makes the first selection bar signal and the second selection signal be in a first logic level when the first and the second delay locking signals and the second comparison signal are in a second logic level.

8. The DLL as recited in claim 4, wherein the weight controller makes the first selection signal and the second selection bar signal be in a second logic level and makes the first selection bar signal and the second selection signal be in a first logic level when the first and the second delay locking signals are in a second logic level and the second comparison signal is in a first logic level.

9. The DLL as recited in claim 4, wherein the phase mixer includes:
a first phase selector for correcting a phase of the first internal clock signal based on the first and the second selection signals and the first and the second selection bar signals; and
a second phase selector for correcting a phase of the second internal clock signal based on the first and the second selection signals and the first and the second selection bar signals.

10. The DLL as recited in claim 9, wherein the first phase selector includes a plurality of unit phase mixers each of which receives the first and the second selection signals or the first and the second selection bar signals.

11. The DLL as recited in claim 10, wherein each of the plurality of unit phase mixers includes:

a first PMOS transistor whose source and gate are respectively connected to a power supply voltage and one of the first and the second internal clock signals;
a second PMOS transistor whose source and gate are respectively connected to a drain of the first PMOS transistor and one of the first and the second selection signals and the first and the second selection bar signals;
a first NMOS transistor whose source and gate are respectively connected to a ground and one of the first and the second internal clock signals; and
a second NMOS transistor whose drain and gate are respectively connected to a grain of the second PMOS transistor and one of the first and the second selection signals and the first and the second selection bar signals.

12. A delay locked loop (DLL) capable of correcting a duty ratio of a clock signal comprising:
a clock buffer for receiving an external clock signal and an inverted external clock signal to generate a rising edge clock signal by buffering the external clock signal and the inverted external clock signal;
a delay means for delaying the rising edge clock signal based on a first comparison signal in order to generate a first internal clock signal and a second internal clock signal and generating a first delay locking signal and a second delay locking signal based on the first comparison signal;
a duty correction means for receiving the first and the second internal clock signals and the first and the second delay locking signals to generate a mixed clock signal which is duty corrected by mixing phases of the first and the second internal clock signals applying a first weight and a second weight to the first and the second internal clock signals respectively;
a delay model unit for delaying the mixed clock signal for a predetermined delay time to generate a feed-backed clock signal; and
a first phase detector which receives the rising edge clock signal and the feed-backed clock signal to generate the first comparison signal by comparing phases of the rising edge clock signal and the feed-backed clock signal.

13. The DLL as recited in claim 12, wherein the delay means includes:
a delay line controller which receives the first comparison signal and the first and the second delay locking signals to generate a first delay line control signal and a second delay line control signal;
a first delay line which receives the rising edge clock signal and delays the rising edge clock signal based on the first delay line control signal in order to generate the first internal clock signal;
a second delay line which receives an inverted signal of the first internal clock signal and delays the inverted signal based on the second delay line control signal in order to generate the second internal clock signal; and
a locking detector which receives the first comparison signal and determines whether or not the first and the second delay lines are delay locked based on the first comparison signal in order to generate the first and the second delay locking signal.

14. The DLL as recited in claim 13, wherein the duty correction means includes:
a second phase detector which receives inverted signals of the first and the second internal clock signals and determines which one of falling edges of the received signals leads the other in order to generate a second comparison signal;

a weight controller which receives the second comparison signal and the first and the second delay locking signals in order to generate a weight value; and a phase mixer which receives the first and the second internal clock signals to generate the mixed clock signals by mixing phases applying the weight value to the second internal clock signal and a second weight value to the first internal clock signal, wherein the second weight value is a value of subtracting the weight value from 1.

15. The DLL as recited in claim 14, wherein the weight value includes a first selection signal, a second selection signal, a first selection bar signal and a second selection bar signal.

16. The DLL as recited in claim 15, wherein the weight controller makes the first and the second selection signals be in a second logic level and makes the first and the second selection bar signals be in a first logic level when the first and the second delay locking signals are in a first logic level.

17. The DLL as recited in claim 15, wherein the weight controller makes the first and the second selection signals be in a first logic level and makes the first and the second selection bar signals be in a second logic level when the first delay locking signal is in a second logic level and the second delay locking signal is in a first logic level.

18. The DLL as recited in claim 15, wherein the weight controller makes the first selection signal and the second selection bar signal be in a first logic level and makes the first selection bar signal and the second selection signal be in a first logic level when the first and the second delay locking signals and the second comparison signal are in a second logic level.

19. The DLL as recited in claim 15, wherein the weight controller makes the first selection signal and the second selection bar signal be in a second logic level and makes the first selection bar signal and the second selection signal be in a first logic level when the first and the second delay locking signals are in a second logic level and the second comparison signal is in a first logic level.

20. The DLL as recited in claim 15, wherein the phase mixer includes:

a first phase selector for correcting a phase of the first internal clock signal based on the first and the second selection signals and the first and the second selection bar signals; and a second phase selector for correcting a phase of the second internal clock signal based on the first and the second selection signals and the first and the second selection bar signals.

21. The DLL as recited in claim 20, wherein the first phase selector includes a plurality of unit phase mixers each of which receives the first and the second selection signals or the first and the second selection bar signals.

22. The DLL as recited in claim 21, wherein each of the plurality of unit phase mixers includes:

a first PMOS transistor whose source and gate are respectively connected to a power supply voltage and one of the first and the second internal clock signals;

a second PMOS transistor whose source and gate are respectively connected to a drain of the first PMOS transistor and one of the first and the second selection signals and the first and the second selection bar signals;

a first NMOS transistor whose source and gate are respectively connected to a ground and one of the first and the second internal clock signals; and a second NMOS transistor whose drain and gate are respectively connected to a grain of the second PMOS transistor and one of the first and the second selection signals and the first and the second selection bar signals.

23. A method for correcting a duty ratio of a clock signal in a DLL comprising steps of:

a) initializing the DLL, which includes a first delay line and a second delay line connected in series for receiving an external clock signal, and enabling the first delay line for generating a first internal clock signal;

b) passing the first internal clock signal through a feed-back loop for generating a feed-backed clock signal and comparing the feed-backed clock signal with the external clock signal until rising edges of the external clock signal and the feed-backed clock signal are synchronized;

c) enabling the second delay line for generating a second internal clock signal if the rising edges of the external clock signal and the feed-backed clock signal are synchronized;

d) passing the second internal clock signal through the feed-back loop for generating the feed-backed clock signal and comparing the feed-backed clock signal with the external clock signal until rising edges of the external clock signal and the feed-backed clock signal are synchronized; and e) performing a phase mixing operation on the first and second internal clocks if the rising edges of the external clock signal and the feed-backed clock signal are synchronized.

24. The method for correcting a duty ratio of a clock signal in a DLL as recited in claim 23, wherein the first internal clock signal is generated by buffering the external clock signal.

25. The method for correcting a duty ratio of a clock signal in a DLL as recited in claim 23, wherein the step of b) further includes a step of f) controlling a delay amount of the first delay line if the rising edges of the external clock signal and the feed-backed clock signal are not synchronized.

26. The method for correcting a duty ratio of a clock signal in a DLL as recited in claim 23, wherein the step of d) further includes a step of g) controlling a delay amount of the second delay line if the rising edges of the external clock signal and the feed-backed clock signal are not synchronized.

* * * * *